United States Patent
Zaal et al.

(10) Patent No.: US 7,110,091 B2
(45) Date of Patent: Sep. 19, 2006

(54) LITHOGRAPHIC APPARATUS, DEVICE MANUFACTURING METHOD, AND DEVICE MANUFACTURED THEREBY

(75) Inventors: Koen Jacobus Johannes Maria Zaal, Eindhoven (NL); Tjarko Adriaan Rudolf Van Empel, Eindhoven (NL); Joost Jeroen Ottens, Veldhoven (NL); Jan Hopman, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 96 days.

(21) Appl. No.: 10/896,367

(22) Filed: Jul. 22, 2004

(65) Prior Publication Data
US 2005/0030512 A1 Feb. 10, 2005

(30) Foreign Application Priority Data
Jul. 23, 2003 (EP) ................... 03077318

(51) Int. Cl.
*G03B 27/62* (2006.01)
*G03B 27/58* (2006.01)
*H02N 13/00* (2006.01)

(52) U.S. Cl. ................ 355/75; 355/72; 361/234
(58) Field of Classification Search ............. 355/53, 355/72–76; 361/234; 378/34, 35; 310/10, 310/12
See application file for complete search history.

(56) References Cited

U.S. PATENT DOCUMENTS

| | | | |
|---|---|---|---|
| 4,666,291 A | 5/1987 | Taniguchi et al. | |
| 5,374,829 A | 12/1994 | Sakamoto et al. | |
| 5,684,669 A * | 11/1997 | Collins et al. | 361/234 |
| 5,923,408 A | 7/1999 | Takabayashi | |
| 5,969,934 A * | 10/1999 | Larsen | 361/234 |
| 6,084,938 A * | 7/2000 | Hara et al. | 378/34 |
| 6,257,564 B1 | 7/2001 | Avneri et al. | |
| 6,529,362 B1 * | 3/2003 | Herchen | 361/234 |
| 6,583,858 B1 * | 6/2003 | van Schaik et al. | 355/72 |
| 2002/0008864 A1 | 1/2002 | Kondo | |
| 2002/0081498 A1 | 6/2002 | Ehrmann | |

FOREIGN PATENT DOCUMENTS

| | | |
|---|---|---|
| EP | 1 378 936 A2 | 1/2004 |
| EP | 1 391 786 A1 | 2/2004 |
| EP | 0 947 884 B1 | 3/2004 |
| JP | 63-39206 | 2/1988 |
| WO | WO 01/90820 A1 | 11/2001 |

\* cited by examiner

*Primary Examiner*—Henry Hung Nguyen
(74) *Attorney, Agent, or Firm*—Pillsbury Winthrop Shaw Pittman LLP (57) ABSTRACT

A lithographic projection apparatus is disclosed. The apparatus includes an illuminator for conditioning a beam of radiation, and an article holder. The article holder includes a plurality of protrusions arranged to provide a substantially flat plane of support for supporting an article to be placed in a beam path of the beam of radiation, and at least one clamping electrode for generating an electrostatic clamping force for clamping the article against the article holder. The clamping electrode includes an electric field changer for locally changing the electrostatic clamping force for leveling local height variations of the substrate.

16 Claims, 7 Drawing Sheets

LITHOGRAPHIC APPARATUS, DEVICE MANUFACTURING METHOD, AND DEVICE MANUFACTURED THEREBY

CROSS-REFERENCE TO RELATED APPLICATIONS

This application claims the benefit of priority from European Patent Application No. 03077318.8, filed Jul. 23, 2003, the entire content of which is incorporated herein by reference.

FIELD

The present invention relates to lithographic projection apparatus, an article holder for a lithographic apparatus, a device manufacturing method, and a device manufactured thereby.

BACKGROUND

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using a suitable electronic device. In both of the situations described hereabove, the patterning device can include one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as needed; and A programmable LCD array. An example of such a construction is given in United States Patent U.S. Pat. No. 5,229,872, which is incorporated herein by reference. As above, the support structure in this case may be embodied as a frame or table, for example, which may be fixed or movable as needed.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are needed, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion".

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

Further, in the context of this application, the "article" may be any of the above mentioned terms wafer, reticle, mask, or substrate, more specifically terms such as a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

In the photolithographic apparatus as hereabove specified, an article is held to the article holder by a clamping electrode. Such electrostatic clamping may be used, for example, when a substrate is processed in vacuum conditions. This type of processing occurs, for example, when the type of irradiation used for photolithographic processes is in the (soft) x-ray region, also referred to as Extreme Ultraviolet (EUV) region. Electrostatic clamping makes use of an electric field between the article holder and the article. In this way, electrostatic forces are used that are present between electrical charge differences in (local) areas of the article holder and the article in order to provide a clamping pressure. Such electrical charge differences occur when for the electrode in the article holder is charged and, for example, the article is grounded. Otherwise, in the article holder, a plurality of electrodes of opposite voltages may be present, which introduce a likewise opposite charge distribution in the article, leaving no excess charge in the article.

European patent application EP0947884 describes a lithographic apparatus having an article holder wherein protrusions are arranged to improve the flatness of the article. These protrusions have a general diameter of 0.5 mm and are located generally at a distance of 3 mm away from each other and thereby form a bed of supporting members that support the article. A typical height of the protrusions is 5 μm. However, for electrostatic clamping configurations, the wafer tends to be supported unevenly, especially near the boundary of the protrusion configuration, due to the termination of support near the boundary edge. This may cause an upward lifting of the wafer or a downward "sagging", which may result in unacceptable imaging quality.

SUMMARY

The invention has as one of its aspects to provide a photolithographic apparatus, wherein the problem of unevenness of the wafer support of the article holder is addressed and wherein an article is leveled in a controllable way.

In order to achieve the aspect, the photolithographic apparatus of the invention includes a radiation system for providing a projection beam of radiation; an article holder including a plurality of protrusions defining a protrusion configuration arranged to provide a flat plane of support for supporting a substantially flat article to be placed in a beam path of the projection beam of radiation, the article holder including at least one clamping electrode for generating an electrostatic clamping force, for clamping an article against the article holder.

It is an aspect to provide a lithographic projection apparatus. The apparatus includes an illuminator for conditioning a beam of radiation, and an article holder. The article holder includes a plurality of protrusions arranged to provide a substantially flat plane of support for supporting an article to be placed in a beam path of the beam of radiation, and at least one clamping electrode for generating an electrostatic clamping force for clamping the article against the article holder. The at least one clamping electrode includes an electric field changer for locally changing the electrostatic clamping force for leveling local height variations of the substrate.

It is an aspect of the invention to provide an article holder for a lithographic apparatus. The article holder includes a plurality of protrusions arranged to provide a substantially flat plane of support for supporting an article, and at least one clamping electrode for generating an electrostatic clamping force for clamping an article against the article holder. The at least one clamping electrode includes an electric field changer for locally changing the electrostatic clamping force for levelling local height variations of the substrate.

It is an aspect of the invention to provide a device manufacturing method. The method includes patterning a beam of radiation with a patterning device that is supported by a first article holder, projecting the patterned beam of radiation onto a target portion of a substrate that is supported by a second article holder, clamping the patterning device against the first article holder with an electrostatic clamping force generated by at least one clamping electrode, and changing an electric field with an electric field changer for levelling local height variations of the patterning device. A device manufactured by this method is also provided.

It is an aspect of the invention to provide a device manufacturing method that includes patterning a beam of radiation with a patterning device that is supported by a first article holder, projecting the patterned beam of radiation onto a target portion of a substrate that is supported by a second article holder, clamping the substrate against the second article holder with an electrostatic clamping force generated by at least one clamping electrode, and changing an electric field with an electric field changer for levelling local height variations of the substrate.

By providing an article holder with a perforated clamping electrode and/or by providing a clamping electrode wherein the clamping electrode includes a boundary edge that varies a plurality of times within at least one boundary edge line segment that is adjacent to least one protrusion, local height variations of an article due to uneven clamping pressures may be circumvented, since the electrostatic clamping pressure may be locally reduced. In practice, due to boundary effects electrostatic forces are quite hard to predict precisely. Therefore, in another aspect, these perforations and/or contour variations may be provided in an iterative measurement process, wherein local height variations of a wafer are measured, whereupon microperforations or microundulations of the boundary edge are added in order to improve a measured article flatness. In this respect it is noted that the (micro)perforations are "small" with respect to the area spanned by adjacent protrusions, that is, the area of a perforation ranges substantially from 0.01 to 50% of an average area formed by adjacent protrusions. In another aspect it is noted that by varying the boundary edge a plurality of times within at least one boundary edge line segment that is adjacent to least one protrusion, at least is understood as having a locally curved shaped that forms microundulations or curves between two protrusions in a variation that is at least 5%, preferably 20% larger than an overall curvature of an electrode boundary edge. Furthermore, this definition it is not intended to be limited to curved shapes but also encompasses shapes that have acute edges such as, for example, a zig-zag shape.

In an embodiment, the perforations are generally circular. In another preferred embodiment, the perforations are generally slit-shaped.

The perforations and/or slits may be of a dimension ranging from about 0.1 to about 0.5 mm.

By providing perforations in this way, the clamping electrode may be a single piece, controlled by a single control voltage.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9a end 9b show detailed plan views of clamping electrode boundary edges that are modified according to the invention.

DETAILED DESCRIPTION

Figure 1:
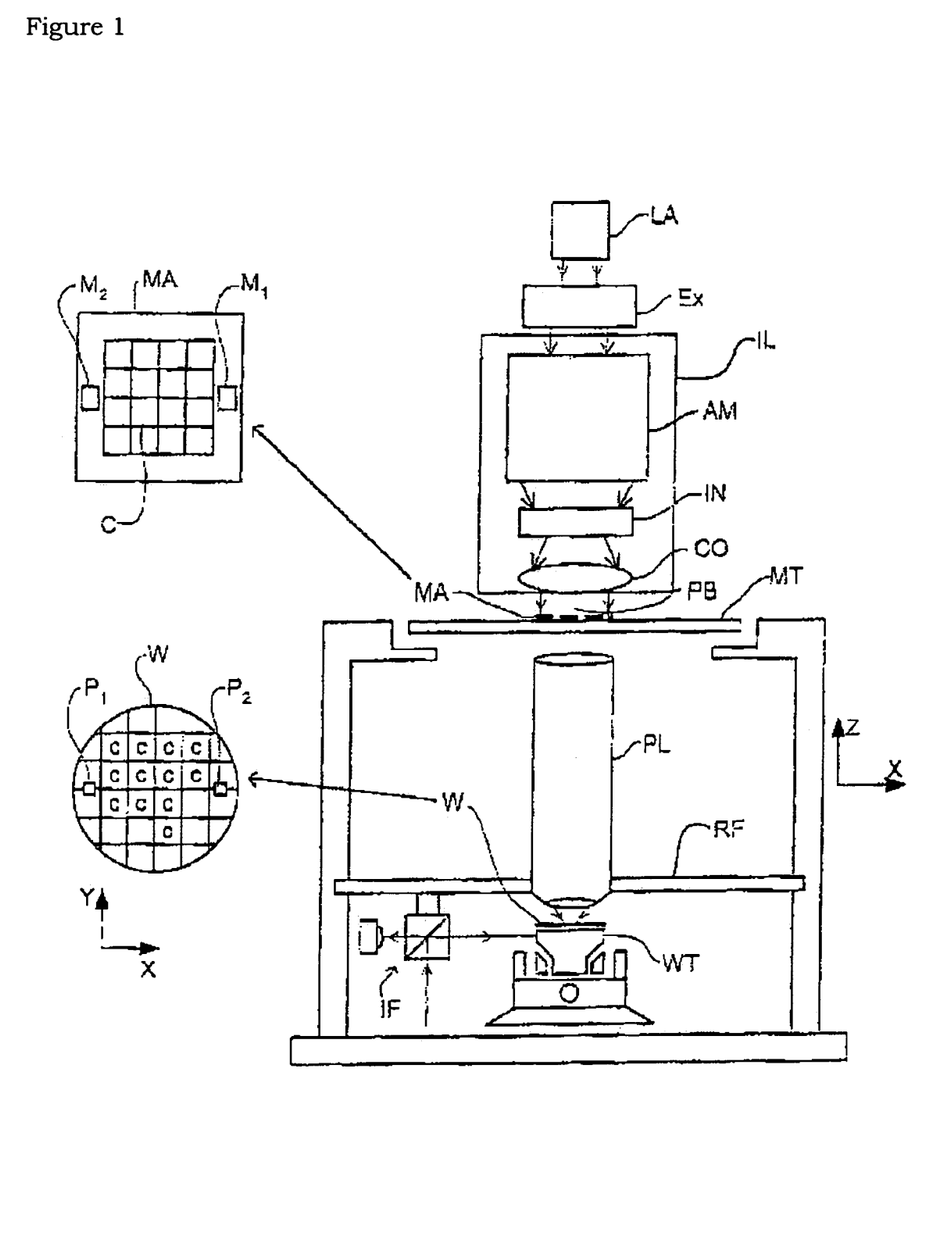
FIG. 1 depicts a lithographic projection apparatus according to an embodiment of the invention.

FIG. 1 schematically depicts a lithographic projection apparatus according to a particular embodiment of the invention. The apparatus includes: a radiation system Ex, IL, for supplying a projection beam PB of radiation (e.g. light in the deep ultraviolet region). In this particular case, the radiation system also includes a radiation source LA; a first object table (mask table) MT provided with a mask holder for holding a mask MA (e.g. a reticle), and connected to a first positioning device PM for accurately positioning the mask with respect to item PL; a second object table (substrate table) WT provided with an article holder for holding a substrate W (e.g. a resist coated silicon wafer), and connected to a second positioning device PW for accurately positioning the substrate with respect to item PL; and a projection system ("lens") PL for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example, with a reflective mask. Alternatively, the apparatus may employ another kind of patterning device, such as a programmable mirror array of a type as referred to above.

The source LA (e.g. an excimer laser source) produces a beam of radiation. This beam is fed into an illumination system (illuminator) IL, either directly or after having a traversed conditioning device, such as a beam expander Ex, for example. The illuminator IL may include an adjusting device AM for setting the outer and/or inner radial extent (commonly referred to as s-outer and s-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and an interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
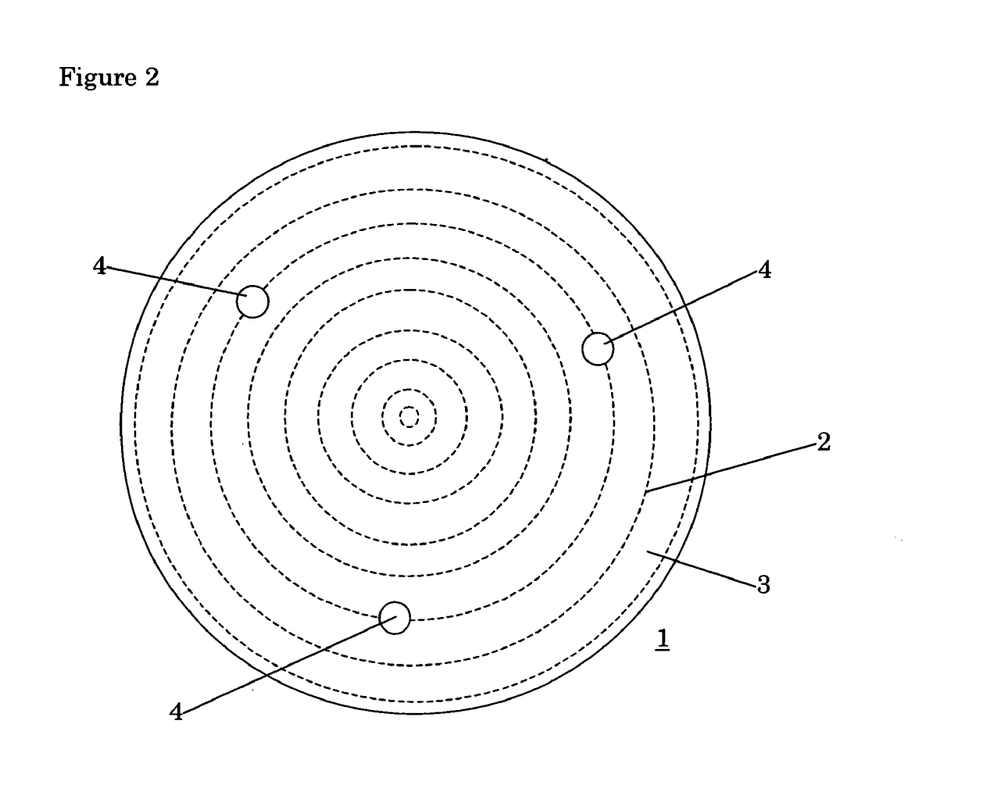
FIG. 2 depicts a plan view of an article holder depicted in FIG. 1.

In FIG. 2, a schematic plan view is illustrated of an article holder 1 according to the invention. In the figure, by the dotted lines, a plurality of protrusions 2 is pictured, the protrusions oriented in substantially concentric circles. To improve the intelligibility, only a few protrusions are referenced in the pictures. These protrusions 2 have a general diameter of about 0.5 mm and are located generally at a distance of about 3 mm away from each other and thereby form a bed of supporting members that support the article, such as a wafer or reticle. Furthermore, by reference numeral 3 is indicated a clamping electrode. The clamping electrode 3 may be a conducting layer that is buried in a base plate of the article holder, supporting the protrusions. The clamping electrode 3, when charged, generates an electrostatic clamping force to thereby attract an article against the distal ends of the protrusions 2. In FIG. 2, preferably symmetrically in the form of an isosceles triangle, a plurality of through-holes 4 are indicated. The through-holes 4 may serve to accommodate ejection pins (not shown), for ejecting the article from the article holder after a photo-lithographic process has been carried out. Otherwise, in the article holder, through-holes may be present to accommodate a feeding device for feeding a backfill gas to the article holder.

Such backfill-gas may be used to fill the spaces formed between the protrusions 2, a base plate that forms a ground layer for supporting the protrusions and the backside of an article, such as a wafer or reticle, clamped by the article holder. Such a backfill gas enhances the heat transfer capability from the article to the article holder.

Figure 3:
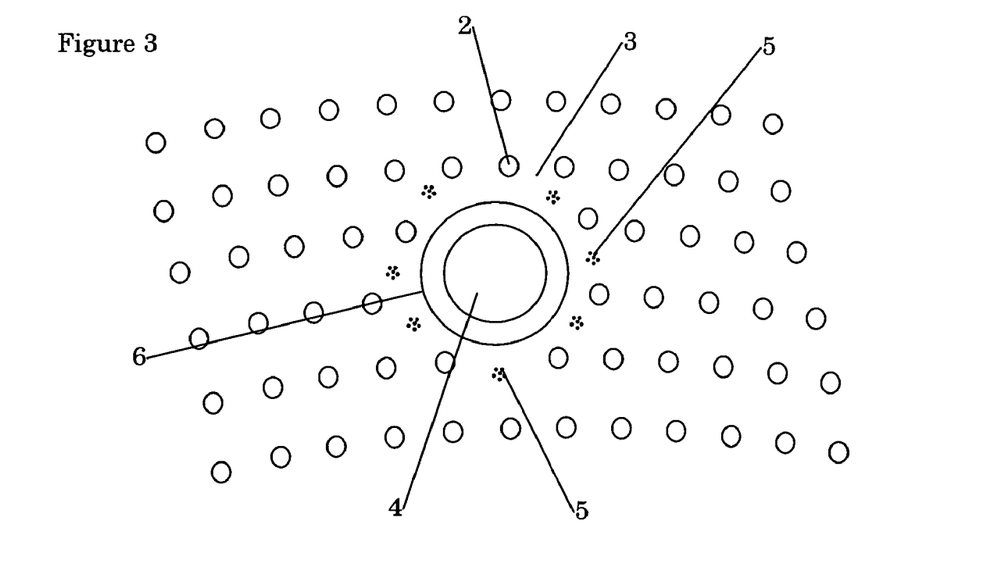
FIG. 3 depicts a first embodiment of an article holder of a lithographic projection apparatus of the invention.

Turning now to FIG. 3, there is depicted a detail of article holder 1 near the through-hole 4. Although in this description, the invention is demonstrated in the vicinity of such a through-hole 4, the invention may be very well applied in other areas, such as, for example, in the vicinity of an irregularity near the perimeter of the article holder (in the art known as "notches"). The invention may even be applied outside the context of an irregular boundary form, since it may serve to resolve local pressure peaks that may arise in a protrusion configuration due to the overall protrusion distribution. However, the presence of through-hole 4 is a good example of a how a local support 6f the article on the article holder may be variable, since the through-hole introduces an unsupported area of the article that covers the through-hole, and in the direct vicinity of the through-hole. Therefore, the article may deform, depending on the nature of the support and the magnitude of the of the unsupported area, to an even unacceptable proportions, so that a focus error or overlay error runs out of budget. In order to prevent this, according to the invention, clamping electrode 3 includes perforations 5 for locally decreasing the electrostatic clamping force. In this way, local height variations of wafer due to uneven clamping pressures may be circumvented, since the electrostatic clamping pressure may be locally reduced. Hence the article may be more evenly supported, resulting in a reduced overlay error or focus error.

Figure 4:
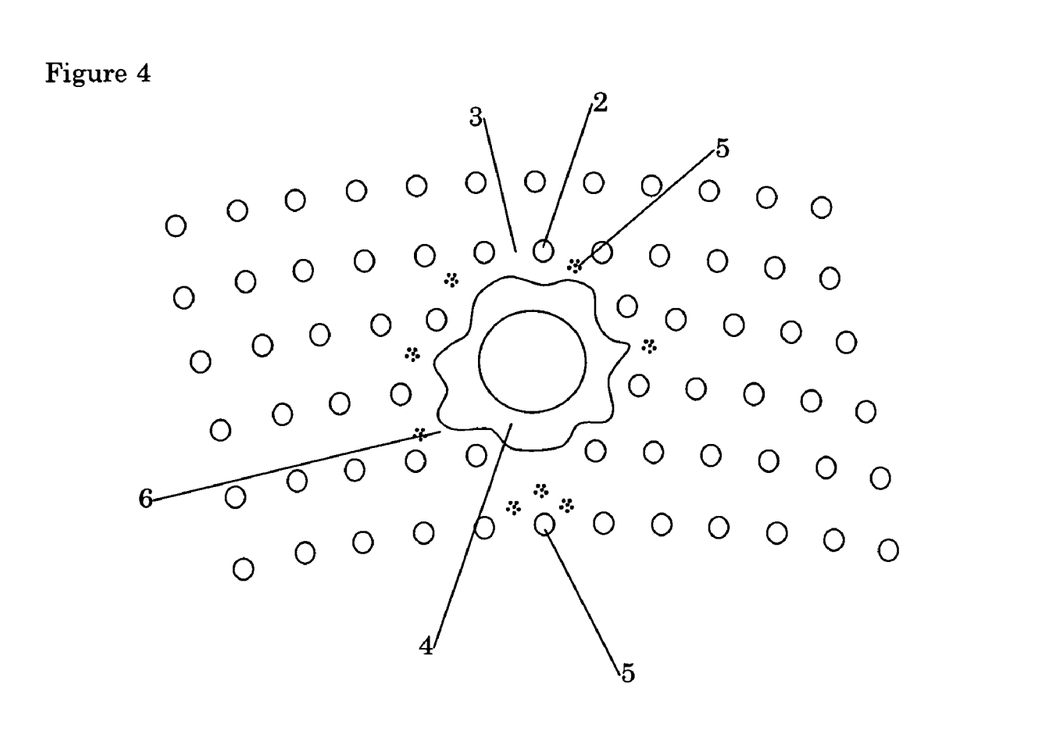
FIG. 4 depicts a second embodiment of an article holder of a lithographic projection apparatus of the invention.

In FIG. 4, an alternative embodiment is shown, in which the electrostatic clamping force may be even further controlled. Here, in addition, the clamping electrode 3 includes a boundary edge 6 that is curved locally around at least some of boundary protrusions 2. Such a curve may be viewed in general as a plurality of overlapping circles, each oriented with coaxially with respect to a protrusion. The invention may even applied in combination with non-overlapping circles. However, the overlapping circles offer the benefit of a single piece electrostatic clamp, that can be controlled by a single control voltage.

Figure 5:
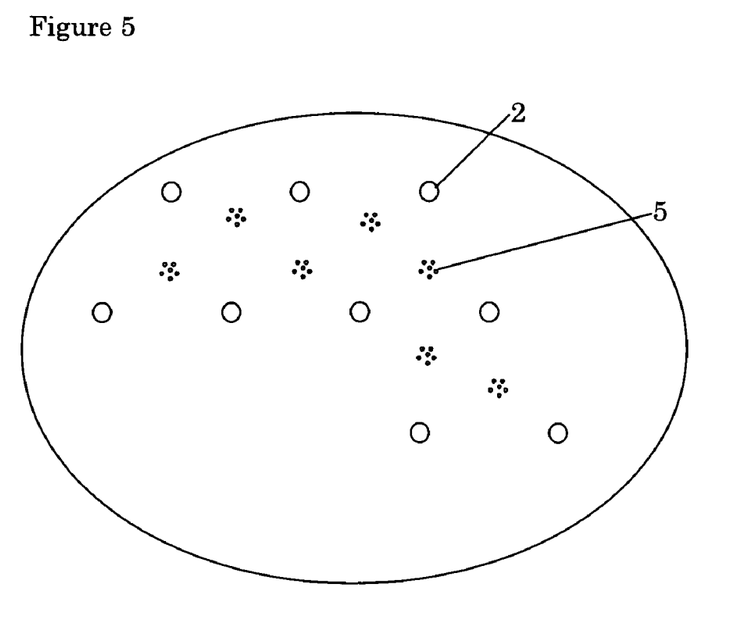
FIG. 5 depicts a detail of the embodiment of FIG. 3.

FIG. 5 shows a detail of the configuration of FIG. 3. In FIG. 5, protrusions 2 are shown independent of a specific boundary configuration. Here, the perforations 5 are shown to be present in a central area of a triangle formed by three neighboring protrusions. In this area, due to the lack of support, an article tends to be clamped too hard, so that the article "sags" and focus and overlay errors are increased. Due to the perforations, such sagging may be prevented, thus decreasing the focus and overlay errors.

Figure 6:
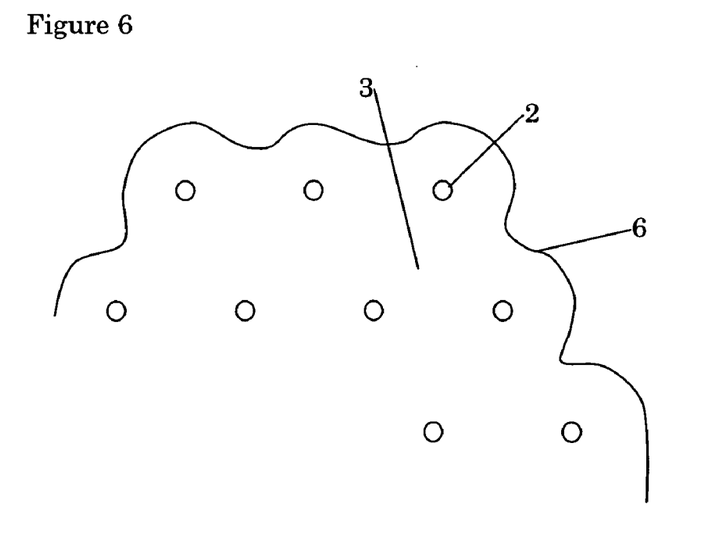
FIG. 6 depicts a detail of the embodiment of FIG. 4.

FIG. 6 shows a detail of FIG. 4. Boundary 6 is curved locally, having a radius curvature that is approximately in the order of the distance of the boundary to a next protrusion 2. In this way, local variations of an electric field may be controlled and evened out by locally deforming the boundary edge 6 of the clamping electrode 3.

Figure 7:
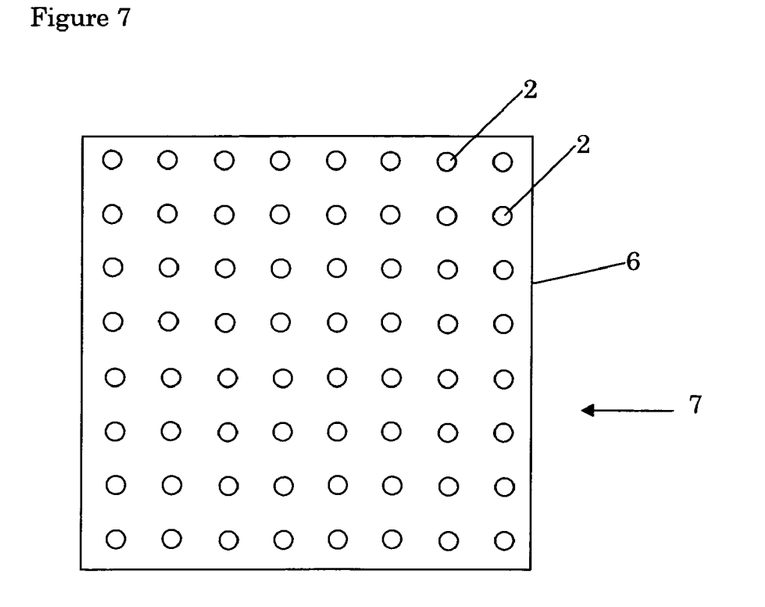
FIG. 7 depicts a third embodiment of an article holder of a lithographic projection apparatus of the invention.
Figure 8:
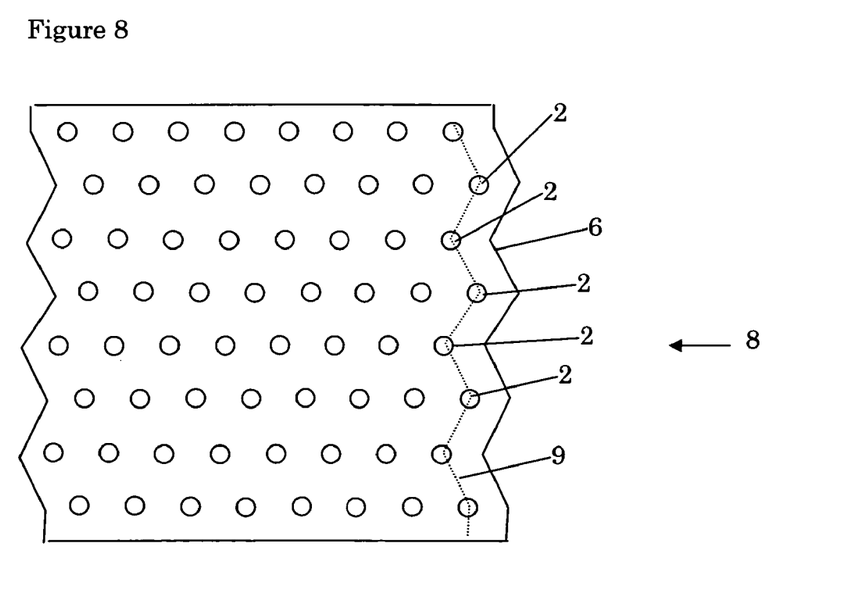
FIG. 8 depicts a fourth embodiment of an article holder of a lithographic projection apparatus of the invention.

FIGS. 7 and 8 depict a schematic plan view of a reticle holder 7 for use in EUV-systems, in particular, where the reticle is of a reflective type. These reticle holders 7 are generally square in shape, and are supported by a plurality of protrusions. For such square shapes, the basic configuration may be square (FIG. 7) or triangular (FIG. 8), the latter having a relative less variation in span between neighboring burls. According to the invention, the clamping electrode includes a boundary edge 6 that is shaped according to a circumferential line connecting adjacent boundary protrusions. In FIG. 7, this results in a straight line, wherein the improvement is in a somewhat reduced distance of the boundary edge 6 to the half span width of two adjacent protrusions. By such an optimized edge, the effects of overhang can be reduced in relation to a wafer where, for example, the electrode would extend as far as half the protrusion distance. In FIG. 8, an article holder for a reflective square reticle 8 is shown, wherein the protrusion configuration is triangular. In this setup, the boundary edge 6 is optimized, by shaping the edge 6 according to a varying circumferential line 9 connecting adjacent boundary protrusions 2.

Figure 9:
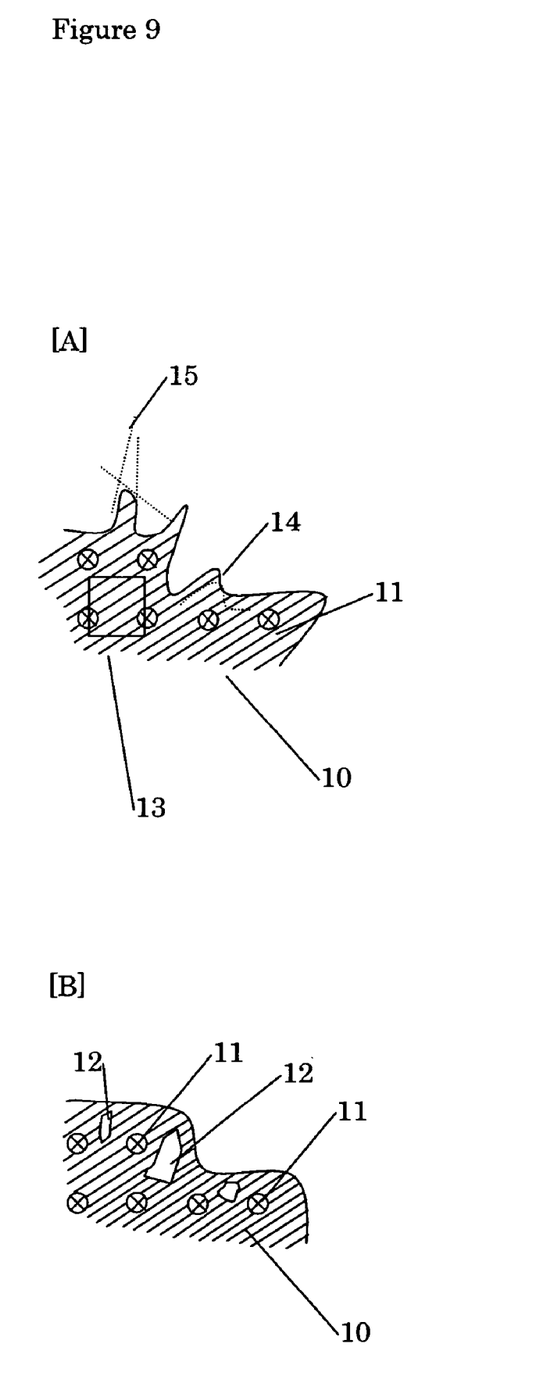

Finally, FIGS. 9a and 9b show detailed plan views of a clamping electrode boundary edges 6 that are modified according to the invention. In the figure, by the hatched area 10 the clamping electrode is indicated. Furthermore, crossed circles 11 indicate protrusions for supporting an article. Furthermore, the white enclosed areas 12 are perforations for locally decreasing the electrostatic clamping force, in order to achieve a better flatness of the article. From the figure, it is apparent that the areas may have shapes that differ from perfect round shapes. Furthermore, it is apparent that the area of the perforations may vary, more particular, is of an order that is a fraction of an average area 13 indicated schematically in FIG. 9 by neighboring protrusions 2.

Furthermore, from FIG. 9 it is apparent that the boundary edge 6 may vary a plurality of times within at least one boundary edge line segment that is adjacent to least one protrusion. Such a line segment is indicated in the picture by reference numeral 14 and has a length ranging from 0.1 to 10 times an average span between two neighboring protrusions. Furthermore, schematically, tangential lines 15 are indicated tangent to the boundary edge 6. FIG. 9 is shown to disclose a boundary edge 6 having a tangential line tangent to the boundary edge that varies in direction so as to follow a local contour formed by the circumferential line around at least some boundary protrusions 2.

Figure 10:
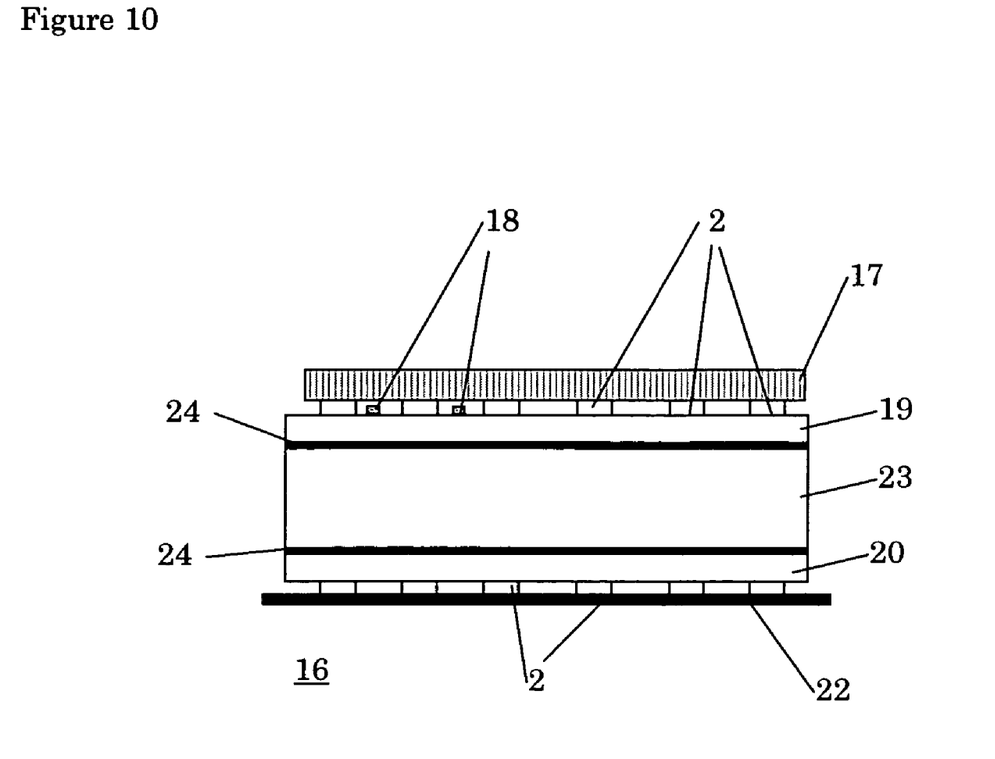
FIG. 10 shows a side view of an article holder showing a fifth embodiment of the invention.

FIG. 10 shows a fifth embodiment of the invention, wherein the electric field is locally changed for leveling local height variations of the article, which in this case could be a clamp 16 for clamping a fiducial 17 which is used for alignment purposes of a substrate to be patterned. In this case, a dielectric layer and/or a grounding strip 18 can be provided, that is locally provided covering the electrode. In case of a grounding strip, such could be provided easily by etching or local implanting, in order to provide a local conductive layer that is grounded and covers the electric clamp. The grounded strip prevents the electric field from propagating which will cause a local attenuation which is similar to providing a hole in the clamp. Otherwise, the strip could be a dielectric layer, which increases the electric force exerted on the fiducial. In this example, the fiducial 16 clamp of FIG. 10 includes a top ULE layer 19 on which protrusions 2 are arranged to provide a flat support. Likewise, a bottom ULE layer 20 is also provided with protrusions 21, that rest on a supporting part 22, e.g. a moving stage. The clamp is further provided with a central Zerodur layer 23, that is bonded to the ULE layers 19 and 20 by aluminum bonding layer 24 which serve as clamping electrodes.

While specific embodiments of the invention have been described above, it will be appreciated that the invention may be practiced otherwise than as described. The description is not intended to limit the invention.

What is claimed is:

1. A lithographic projection apparatus comprising:
   an illuminator for conditioning a beam of radiation; and
   an article holder comprising a plurality of protrusions arranged to provide a substantially flat plane of support for supporting an article to be placed in a beam path of said beam of radiation, and at least one clamping electrode for generating an electrostatic clamping force for clamping the article against the article holder,
   wherein said at least one clamping electrode comprises an electric field changer for locally changing said electrostatic clamping force for leveling local height variations of said article.

2. A lithographic projection apparatus according to claim 1, wherein said electric field changer comprises at least one perforation in the clamping electrode.

3. A lithographic projection apparatus according to claim 1, wherein said electric field changer comprises a dielectric layer and/or a ground layer covering said clamping electrode.

4. A lithographic projection apparatus according to claim 1, wherein said electric field changer comprises a boundary edge that varies a plurality of times within at least one boundary edge line segment that is adjacent to least one protrusion.

5. A lithographic projection apparatus according to claim 1, wherein the clamping electrode comprises a boundary edge that is shaped according to a circumferential line connecting adjacent boundary protrusions.

6. A lithographic projection apparatus according to claim 5, wherein said boundary edge is curved locally around at least some boundary protrusions.

7. A lithographic projection apparatus according to claim 2, wherein said perforation is generally circular.

8. A lithographic projection apparatus according to claim 2, wherein said perforation is generally slit-shaped.

9. A lithographic projection apparatus according to claim 2, wherein said perforation has a dimension which is a fraction of an average span between two neighboring protrusions.

10. A lithographic projection apparatus according to claim 9, wherein said perforation ranges from about 0.1 to about 0.5 mm.

11. A lithographic projection apparatus according to claim 2, wherein said perforation is located central to a triangle formed by three protrusions.

12. A lithographic projection apparatus according to claim 1, wherein said clamping electrode is a single piece, controlled by a single control voltage.

13. A lithographic projection apparatus according to claim 1, wherein said protrusions are generally cylindrically formed.

14. An article holder for a lithographic apparatus, the article holder comprising:
   a plurality of protrusions arranged to provide a substantially flat plane of support for supporting an article; and
   at least one clamping electrode for generating an electrostatic clamping force for clamping an article against the article holder, wherein said at least one clamping electrode comprises an electric field changer for locally changing said electrostatic clamping force for levelling local height variations of said article.

15. A device manufacturing method comprising:
   patterning a beam of radiation with a patterning device that is supported by a first article holder;
   projecting the patterned beam of radiation onto a target portion of a substrate that is supported by a second article holder;
   clamping the patterning device against the first article holder with an electrostatic clamping force generated by at least one clamping electrode; and
   levelling local height variations of the patterning device with an electric field changer.

16. A device manufacturing method comprising:
   patterning a beam of radiation with a patterning device that is supported by a first article holder;
   projecting the patterned beam of radiation onto a target portion of a substrate that is supported by a second article holder;
   clamping the substrate against the second article holder with an electrostatic clamping force generated by at least one clamping electrode; and
   levelling local height variations of the substrate with an electric field changer.

* * * * *